(12) United States Patent
Kobayashi et al.

(10) Patent No.: US 10,546,950 B2
(45) Date of Patent: Jan. 28, 2020

(54) SEMICONDUCTOR DEVICE

(71) Applicant: FUJI ELECTRIC CO., LTD., Kawasaki (JP)

(72) Inventors: Yusuke Kobayashi, Tsukuba (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/113,542

(22) Filed: Aug. 27, 2018

(65) Prior Publication Data

US 2019/0109227 A1 Apr. 11, 2019

(30) Foreign Application Priority Data

Oct. 5, 2017 (JP) .................. 2017-195480

(51) Int. Cl.
| | |
|---|---|
| H01L 29/15 | (2006.01) |
| H01L 29/78 | (2006.01) |
| H01L 21/02 | (2006.01) |
| H01L 21/04 | (2006.01) |
| H01L 29/06 | (2006.01) |
| H01L 29/08 | (2006.01) |
| H01L 29/10 | (2006.01) |
| H01L 29/16 | (2006.01) |
| H01L 29/423 | (2006.01) |
| H01L 29/49 | (2006.01) |
| H01L 29/66 | (2006.01) |

(52) U.S. Cl.
CPC .... *H01L 29/7806* (2013.01); *H01L 21/02378* (2013.01); *H01L 21/02529* (2013.01); *H01L 21/02634* (2013.01); *H01L 21/046* (2013.01); *H01L 21/049* (2013.01); *H01L 21/0475* (2013.01); *H01L 29/0696* (2013.01); *H01L 29/0865* (2013.01); *H01L 29/0869* (2013.01); *H01L 29/0882* (2013.01); *H01L 29/1095* (2013.01); *H01L 29/1608* (2013.01); *H01L 29/4236* (2013.01); *H01L 29/4916* (2013.01); *H01L 29/66068* (2013.01); *H01L 29/66734* (2013.01); *H01L 29/7813* (2013.01); *H01L 29/7811* (2013.01)

(58) Field of Classification Search
CPC .................................................. H01L 29/7806
USPC ........................................................... 257/77
See application file for complete search history.

(56) References Cited

U.S. PATENT DOCUMENTS

2010/0271852 A1    10/2010  Nakamura
2015/0333175 A1*  11/2015  Kiyosawa ........... H01L 29/6606
                                                                257/77

FOREIGN PATENT DOCUMENTS

JP          2010-259278 A     11/2010
JP          2011-9387 A        1/2011

* cited by examiner

*Primary Examiner* — Ajay Arora

(57) ABSTRACT

At bottom of a gate trench, a conductive layer is provided. A Schottky junction is formed along a side wall of the gate trench by the conductive layer and the n-type current spreading region. The Schottky junction constitutes one unit cell of a trench-type SBD. In the gate trench, a gate electrode is provided on the conductive layer, via an insulating layer. The gate electrode constitutes one unit cell of a trench-gate-type vertical MOSFET. In other words, one unit cell of the trench gate MOSFET and one unit cell of the trench-type SBD are disposed built into a single gate trench and oppose each other in a depth direction.

17 Claims, 12 Drawing Sheets

SEMICONDUCTOR DEVICE

CROSS REFERENCE TO RELATED APPLICATIONS

This application is based upon and claims the benefit of priority of the prior Japanese Patent Application No. 2017-195480, filed on Oct. 5, 2017, the entire contents of which are incorporated herein by reference.

BACKGROUND

1. Field

Embodiments of the invention relate to a semiconductor device.

2. Description of Related Art

Conventionally, reduced ON resistance is demanded of a power semiconductor device that uses a semiconductor material (hereinafter, wide bandgap semiconductor material) having a bandgap that is wider than that of silicon. For example, in a vertical metal oxide semiconductor field effect transistor (MOSFET), a trench gate structure is adopted that facilitates structurally low ON resistance characteristics as compared to a planar gate structure in which a MOS gate is disposed in a flat plate-like shape on a front surface of a semiconductor chip. A trench gate structure is a MOS gate structure in which a MOS gate is embedded in a trench formed at the front surface of the semiconductor chip. The trench gate structure enables a reduction of the ON resistance by a reduction of cell pitch.

A conventional trench gate MOSFET will be described taking, as an example, a case in which silicon carbide (SiC) is used as the wide bandgap semiconductor material. FIG. 12 is a cross-sectional view of a structure of a conventional semiconductor device. The trench gate MOSFET depicted in FIG. 12 is fabricated using a semiconductor substrate (hereinafter, silicon carbide substrate) 110 that contains silicon carbide and in which silicon carbide layers constituting an $n^-$-type drift region 102 and a p-type base region 104 are sequentially formed by epitaxial growth on a front surface of an $n^+$-type starting substrate (hereinafter, $n^+$-type silicon carbide substrate) 101 containing silicon carbide. First and second $p^+$-type regions 121, 122 are selectively formed at a deep position from the front surface of the silicon carbide substrate 110, closer to a drain than is a bottom of a trench (hereinafter, gate trench) 107.

The first $p^+$-type region 121 underlies the bottom of the gate trench 107. The second $p^+$-type region 122 is selectively provided between (mesa region) adjacent gate trenches 107 and is separated from the gate trench 107. Provision of the first and second $p^+$-type regions 121, 122 suppresses electric field applied to a gate insulating film in the OFF state. Therefore, the cell pitch and the ON resistance may be reduced while breakdown voltage is maintained. A MOS gate in one gate trench 107 and adjacent mesa regions sandwiching the MOS gate constitute one unit cell (configuration unit of an element). Reference numerals 103, 105, 106, 108, 109, 111 to 113 are an n-type current spreading region, an $n^+$-type source region, a $p^{++}$-type contact region, a gate insulating film, a gate electrode, an interlayer insulating film, a source electrode, and a drain electrode, respectively.

Conventionally, to reduce the number of components and facilitate cost reductions, use of a parasitic diode (body diode) formed in the trench gate MOSFET in place of an externally provided Schottky barrier diode (SBD) is known. Nonetheless, when a body diode of a trench gate MOSFET is used in place of an external SBD, increases in turn OFF loss and degradation of the body diode occur. To circumvent these problems, fabrication of a built-in trench-type SBD on a single semiconductor chip in which the trench gate MOSFET is fabricated has been proposed.

A conventional trench gate MOSFET in which a trench-type SBD is built-in on a single semiconductor chip will be described. FIG. 13 is a cross-sectional view of another example of a structure of a conventional semiconductor device. The conventional semiconductor device depicted in FIG. 13 differs from the conventional semiconductor device depicted in FIG. 12 in that between adjacent gate trenches 107 of a trench gate MOSFET 131, a trench-type SBD 132 is built-in.

The trench-type SBD 132 includes a trench 141 between the gate trenches 107, and a conductive layer 142 embedded in the trench 141. The trench-type SBD 132 is configured by a Schottky junction 143 of the n-type current spreading region 103 and the conductive layer 142 formed along a side wall of the trench 141. The first $p^+$-type region 121 underlies a bottom of the trench 141 and the second $p^+$-type region is not provided.

As a trench gate MOSFET having a built-in trench-type SBD on the single semiconductor chip, a device has been proposed in which a Schottky junction of a $p^-$-type base region and a barrier metal is formed at a bottom of a source contact trench (for example, refer to Japanese Laid-Open Patent Publication No. 2011-009387 (paragraphs 0031 to 0032, FIG. 1)). In Japanese Laid-Open Patent Publication No. 2011-009387, a path from a source electrode, via a barrier metal, a $p^-$-type base region, an $n^-$-type channel region, an n-type drift region, and an $n^+$-type substrate, to a drain electrode constitutes a Schottky barrier diode and reverse recovery characteristics of the built-in diode are improved.

Further, as another trench gate MOSFET in which a trench-type SBD is built-in on a single semiconductor chip, a device has been proposed in which a Schottky electrode is embedded in a trench that is deeper than a gate trench and forms a Schottky junction with the semiconductor substrate (refer to Japanese Laid-Open Patent Publication No. 2010-259278 (paragraphs 0070 to 0071, FIG. 9)). In Japanese Laid-Open Patent Publication No. 2010-259278, a semiconductor part between trenches in which the Schottky electrode is embedded is designed in a region pinched off by a depletion layer that spreads from the Schottky electrode and electric field significantly exceeding electric field at the time of pinch off is prevented from being applied to the gate trench bottom.

SUMMARY

According to an embodiment of the invention, a semiconductor device includes a semiconductor substrate containing a semiconductor material having a bandgap that is wider than that of silicon; a first semiconductor layer of a first conductivity type provided on a front surface of the semiconductor substrate, the first semiconductor layer containing a semiconductor material having a bandgap that is wider than that of silicon; a second semiconductor layer of a second conductivity type provided on a first side of the first semiconductor layer, opposite a second side of the first semiconductor layer facing toward the semiconductor substrate, the second semiconductor layer containing a semiconductor material having a bandgap that is wider than that of silicon; a first semiconductor region of the first conductivity type selectively provided in the second semiconductor layer; a trench penetrating the first semiconductor region and the second semiconductor layer, and reaching the first semiconductor layer; a second semiconductor region underlying a bottom of the trench and selectively provided in the first semiconductor layer, separated from the second semiconductor layer; a conductive layer provided in the trench; an insulating layer provided on the conductive layer, in the trench; an insulating film provided along a side wall of the trench and in contact with and continuous with the insulating layer; a gate electrode provided on the insulating layer and the insulating film, in the trench; a first electrode in contact with the second semiconductor layer and the first semiconductor region; a second electrode provided at a rear surface of the semiconductor substrate; and a Schottky barrier diode constituted by a Schottky junction of the conductive layer and the first semiconductor layer.

In the embodiment, an interface of the conductive layer and the insulating layer is positioned closer to the semiconductor substrate than is an interface of the second semiconductor layer and the first semiconductor layer.

In the embodiment, a distance from an interface of the conductive layer and the insulating layer, to an interface of the second semiconductor layer and the first semiconductor layer is in a range from 0.3 μm to 0.6 μm.

In the embodiment, the trench has a depth that is in a range of 1.1 μm to 3.2 μm. The conductive layer has a thickness that is in a range of 0.1 μm to 0.6 μm.

In the embodiment, the semiconductor device further includes a third semiconductor region of the first conductivity type provided in the first semiconductor layer, the third semiconductor region being in contact with the second semiconductor layer and reaching a deep position closer to the second electrode from the interface of the first semiconductor layer and second semiconductor layer than is the bottom of the trench, the third semiconductor region having an impurity concentration higher than an impurity concentration of the first semiconductor layer. The Schottky barrier diode is constituted by a Schottky junction of the conductive layer and the third semiconductor region.

In the embodiment, the trench is disposed in a striped layout extending in a direction parallel to the front surface of the semiconductor substrate.

Objects, features, and advantages of the present invention are specifically set forth in or will become apparent from the following detailed description of the invention when read in conjunction with the accompanying drawings.

DESCRIPTION OF EMBODIMENTS

Figure 13:
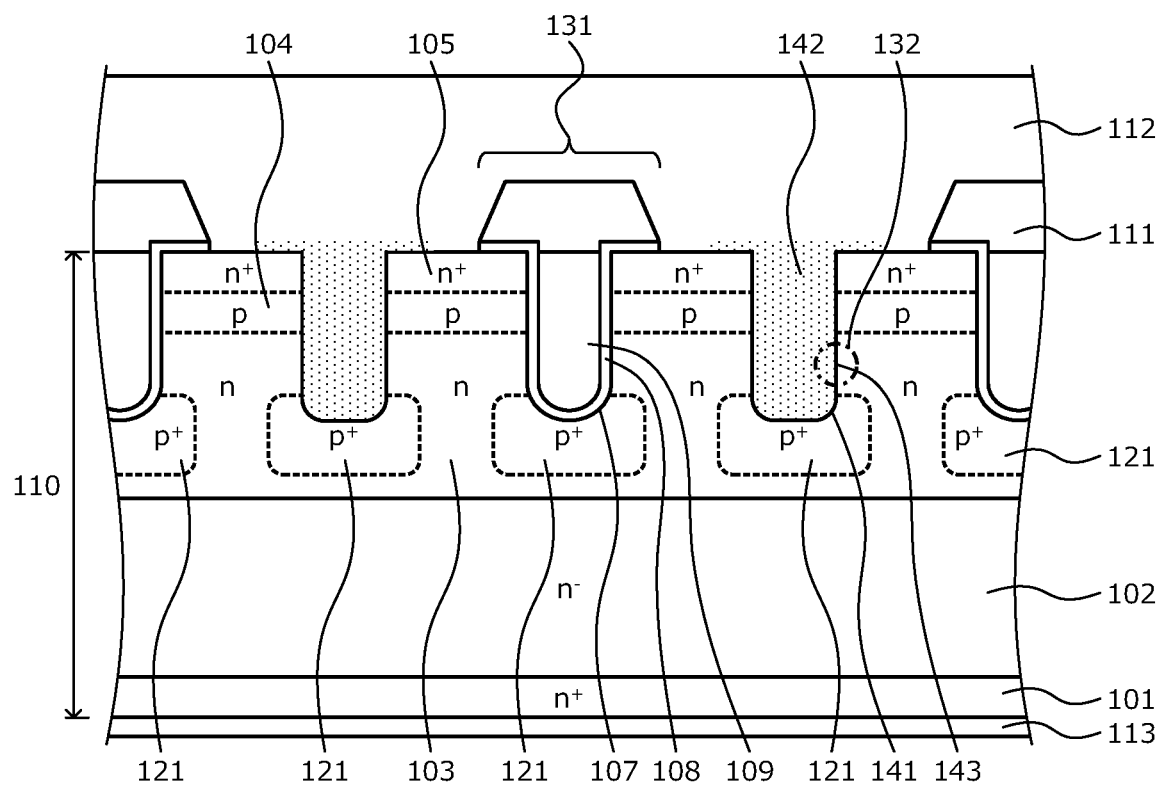
FIG. 13 is a cross-sectional view of another example of a structure of a conventional semiconductor device.

First, problems associated with the conventional techniques will be described. As described above, in the conventional trench gate MOSFET 131 (refer to FIG. 13) with the trench-type SBD 132 built therein, the trench-type SBD 132 is disposed between the adjacent gate trenches 107. Therefore, the cell pitch (distance between the gate trenches 107) is difficult to reduce and a problem arises in that the ON resistance cannot be decreased.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
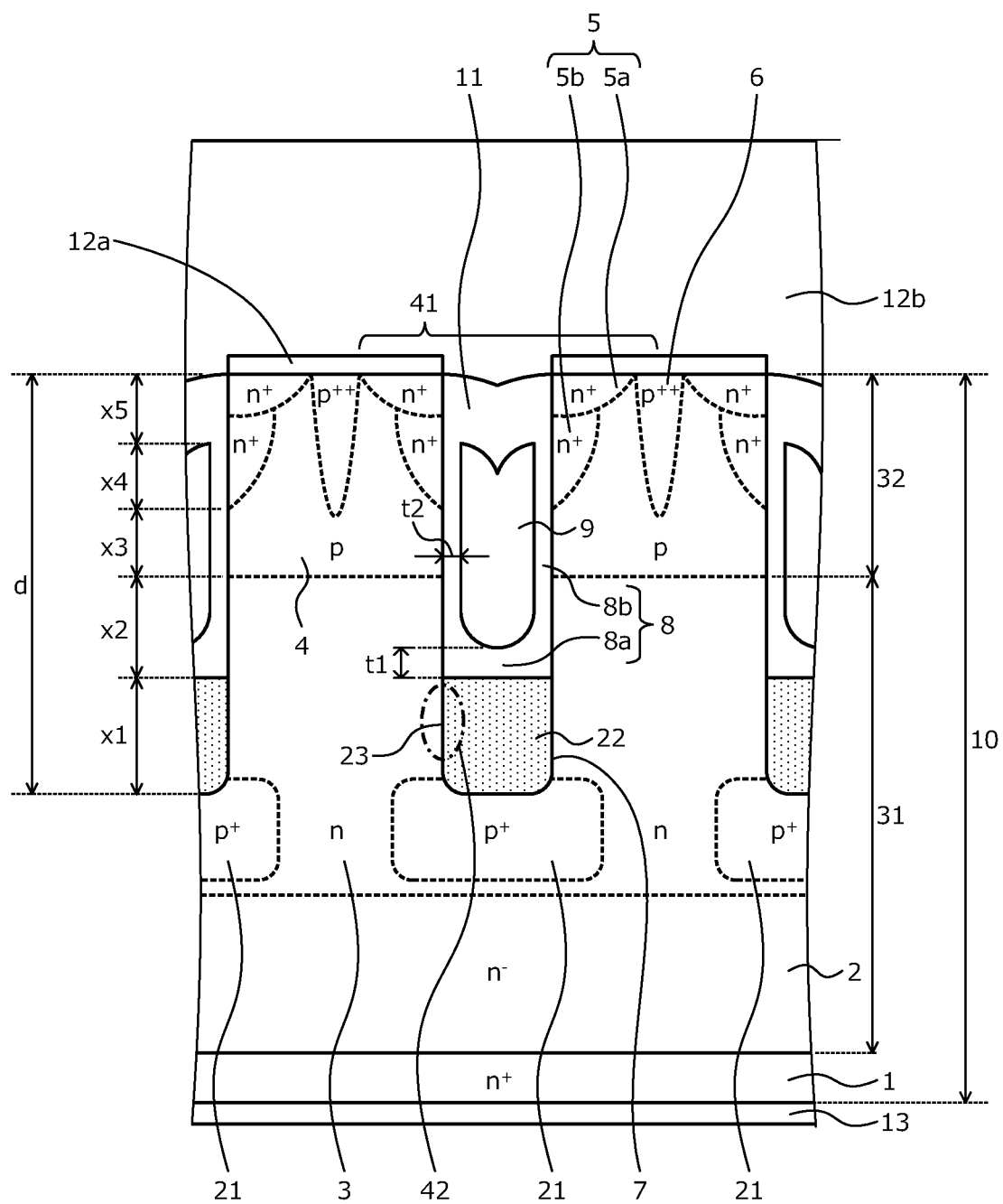
FIG. 1 is a cross-sectional view of a structure of a semiconductor device according to an embodiment.

A semiconductor device according to an embodiment is configured using a semiconductor material (wide bandgap semiconductor material) having a bandgap that is wider than that of silicon. A structure of the semiconductor device according to the embodiment will be described taking, as an example, a case in which, for example, silicon carbide (SiC) is used as the wide bandgap semiconductor material. FIG. 1 is a cross-sectional view of a structure of the semiconductor device according to the embodiment. FIG. 1 depicts one unit cell (configuration unit of an element) of a trench gate MOSFET 41 and ½ of each unit cell on each side of the one unit cell. Further, in FIG. 1, only some of the unit cells disposed in an active region are depicted and an edge termination region surrounding a periphery of the active region is not depicted (similarly in FIGS. 2 to 11).

The active region is a region through which current flows when the semiconductor device is in an ON state. The edge termination region is a region between the active region and a side surface of a semiconductor substrate (semiconductor chip) 10 and is a region that mitigates electric field at a substrate front surface (a front surface of the semiconductor substrate 10) side of an $n^-$-type drift region 2 and that sustains breakdown voltage. In the edge termination region, for example, a breakdown voltage structure such as a p-type region constituting a junction termination extension (JTE) structure or a guard ring, a field plate, RESURF, etc. is disposed. The breakdown voltage is a voltage limit that does not cause errant operation or malfunction of the semiconductor device.

The semiconductor device according to the embodiment and depicted in FIG. 1 is the trench gate MOSFET 41 in which a trench-type SBD 42 is built in the semiconductor substrate (silicon carbide substrate) 10 that contains silicon carbide. The semiconductor substrate 10 is an epitaxial substrate in which silicon carbide layers (first and second semiconductor layers) 31, 32 constituting the n⁻-type drift region 2 and a p-type base region 4 are formed sequentially by epitaxial growth on an n⁺-type starting substrate (n⁺-type silicon carbide substrate) 1 containing silicon carbide. A MOS gate of the trench gate MOSFET is constituted by the p-type base region 4, an n⁺-type source region (first semiconductor region) 5, a p⁺⁺-type contact region 6, a gate trench 7, a gate insulating film 8, and a gate electrode 9 provided on the substrate front surface side.

In particular, in a surface layer on a source side (side facing toward a source electrode 12a) of an n⁻-type silicon carbide layer 31, an n-type region (hereinafter, n-type current spreading region (third semiconductor region) 3 is provided so as to be in contact with a p-type silicon carbide layer 32 (the p-type base region 4). The n-type current spreading region 3 is a so-called current spreading layer (CSL) that reduces carrier spread resistance. The n-type current spreading region 3, for example, is disposed uniformly in a direction parallel to the substrate front surface and so as to be exposed at an inner wall of the gate trench 7. The n-type current spreading region 3, from an interface with the p-type base region 4, reaches a deep position closer to a drain (a drain electrode 13) than is a bottom of the gate trench 7.

A part of the n⁻-type silicon carbide layer 31 excluding the n-type current spreading region 3 is the n⁻-type drift region 2. In other words, between the n⁻-type drift region 2 and the p-type base region 4, the n-type current spreading region 3 is provided to be exposed at the inner wall of the gate trench 7 and in contact with the n⁻-type drift region 2 and the p-type base region 4. In the n-type current spreading region 3, a p⁺-type region (second semiconductor region) 21 is selectively formed so as to underlie the bottom of the gate trench 7.

The p⁺-type region 21 is disposed separated from the p-type base region 4, at a deep position closer to the drain than is an interface of the p-type base region 4 and the n-type current spreading region 3. The p⁺-type region 21 has a function of depleting during the OFF state of the trench gate MOSFET 41 and mitigating electric field applied to a part a later-described conductive layer 22, along the inner wall of the gate trench 7. The p⁺-type region 21 may span from the bottom of the gate trench 7 to a bottom corner part to cover the bottom of the gate trench 7 and the bottom corner part entirely. The bottom corner part of the gate trench 7 is a border of the bottom of the gate trench 7 and a side wall.

An edge of the p⁺-type region 21 facing toward the drain may terminate in the n-type current spreading region 3, or may reach an interface of the n-type current spreading region 3 and the n⁻-type drift region 2, or may terminate in the n⁻-type drift region 2. In other words, a pn junction of the p⁺-type region 21 and the n-type current spreading region 3 (or the n⁻-type drift region 2) is positioned deeper toward the drain than is the bottom of the gate trench 7 and a depth of the first p⁺-type region 21 may be variously changed.

In the p-type silicon carbide layer 32, between (mesa region) the gate trench 7 and an adjacent gate trench 7, the n⁺-type source region 5 and the p⁺⁺-type contact region 6 are each selectively provided. The n⁺-type source region 5, for example, is constituted by a first n⁺-type region 5a and a second n⁺-type region 5b provided at a position deeper from the substrate front surface than is the first n⁺-type region 5a. The first and the second n⁺-type regions 5a, 5b are in contact with each other. The first n⁺-type region 5a may have an impurity concentration that is higher than an impurity concentration of the second n⁺-type region 5b. The second n⁺-type region 5b may be omitted. The p⁺⁺-type contact region 6 is in contact with the first n⁺-type region 5a. A depth of the p⁺⁺-type contact region 6, for example, is deeper than that of the first n⁺-type region 5a.

The gate trench 7 penetrates the n⁺-type source region 5 (the first and the second n⁺-type regions 5a, 5b) and the p-type base region 4 in a depth direction from the front surface (surface of the p-type silicon carbide layer 32) of the semiconductor substrate 10. The gate trench 7 reaches the n-type current spreading region 3 and terminates in the p⁺-type region 21. The depth direction is a direction from the front surface of the semiconductor substrate 10 toward a rear surface. A depth d of the gate trench 7, for example, may be in a range of about 1.1 μm to 3.2 μm. Further, the gate trench 7, as viewed from the front surface side of the semiconductor substrate 10, for example, is disposed in a striped layout extending along a direction (direction orthogonal to the plane of view in FIG. 1) parallel to the front surface of the semiconductor substrate 10.

In the gate trench 7, the conductive layer 22 such as, for example, a metal layer or a poly-silicon (poly-Si) layer is embedded at a bottom-most side of the gate trench 7. The conductive layer 22, at a part not depicted, is drawn to the front surface of the semiconductor substrate 10 and is electrically connected to a source electrode pad 12b described hereinafter. An interface of the conductive layer 22 and an insulating layer 8a is at a deep position closer to the drain than is the interface of the p-type base region 4 and the n-type current spreading region 3. The conductive layer 22 is in contact with the n-type current spreading region 3 at a side wall of the gate trench 7. A Schottky junction 23 is formed along the side wall of the gate trench 7 by the conductive layer 22 and the n-type current spreading region 3.

In other words, one unit cell of the trench-type SBD 42 is constituted by the Schottky junction 23 formed along one side wall of the gate trench 7. Each unit cell of the trench-type SBD 42 extends in a direction in which the striped shape of the gate trench 7 extends. A mathematical area (surface area of the Schottky junction 23) of a unit cell of the trench-type SBD 42 is adjustable by the depth d of the gate trench 7 and a length (length of the gate trench 7 along longitudinal direction as viewed from the front surface side of the semiconductor substrate 10) in which the gate trench 7 extends in the striped shape. The trench-type SBD 42 has a function of preventing degradation of the parasitic diode (body diode) formed in the trench gate MOSFET 41.

Further, in the gate trench 7, the insulating layer 8a is provided on the conductive layer 22 and a MOS gate of one unit cell of the trench gate MOSFET 41 is embedded on the insulating layer 8a. In other words, in one gate trench 7, one unit cell of the trench gate MOSFET 41 and one unit cell of the trench-type SBD 42 are disposed opposing each other across the insulating layer 8a in the depth direction. In the one gate trench 7, a function of a MOSFET and a function of a SBD are realized.

The MOS gate of the trench gate MOSFET is constituted by the gate insulating film 8 and the gate electrode 9. The gate insulating film 8 is constituted by the insulating layer 8a on the conductive layer 22 and an insulating film 8b that is provided along a side wall of the gate trench 7 so as to be in contact with and continuous with the insulating layer 8a. The insulating layer 8a has a thickness t1 that is thicker than a thickness t2 of the insulating film 8b. The gate electrode 9 is provided on the gate insulating film 8 (the insulating layer 8a and the insulating film 8b) in the gate trench 7. The gate electrode 9 is electrically insulated from the conductive layer 22 by the insulating layer 8a and the insulating film 8b.

Further, at the side wall of the gate trench 7, the gate electrode 9 opposes the second $n^+$-type region 5b (or the first and the second $n^+$-type regions 5a, 5b) across the insulating film 8b. An end of the gate electrode 9 toward the drain reaches a deep position closer to a drain than is the interface of the p-type base region 4 and the n-type current spreading region 3. An interlayer insulating film 11 covers the gate electrode 9 embedded in the gate trench 7. The interlayer insulating film 11 may be provided on the gate electrode 9 in the gate trench 7.

The gate electrode 9, at a part not depicted, is drawn to the front surface of the semiconductor substrate 10 and electrically connected with a gate electrode pad (not depicted). The source electrode 12a is in contact with the $n^+$-type source region 5 (the first $n^+$-type region 5a) and the $p^{++}$-type contact region 6 via a contact hole opened in the interlayer insulating film 11, and is electrically connected with the $n^+$-type source region 5 (the first $n^+$-type region 5a) and the $p^{++}$-type contact region 6.

The source electrode 12a is electrically insulated from the gate electrode 9 by the interlayer insulating film 11. The source electrode 12a is electrically connected to the source electrode pad 12b provided on the source electrode 12a and the interlayer insulating film 11. At the rear surface (the rear surface of the $n^+$-type silicon carbide substrate 1 constituting an $n^+$-type drain region) of the semiconductor substrate 10, the drain electrode 13 is provided.

While not particularly limited hereto, for example, dimensions of regions of the semiconductor device according to the embodiment have the following values. A distance (thickness of the conductive layer 22) x1 from an interface of the conductive layer 22 and the insulating layer 8a to the bottom of the gate trench 7 is about 0.1 µm to 0.6 µm. A distance x2 from the interface of the p-type base region 4 and the n-type current spreading region 3 to the interface of the conductive layer 22 and the insulating layer 8a is about 0.3 µm to 0.6 µm. A distance x3 from an edge of the second $n^+$-type region 5b toward the drain to the interface of the p-type base region 4 and the n-type current spreading region 3 is about 0.1 µm to 1.0 µm. A distance x4 from an edge of the gate electrode 9 toward a source to an edge of the second $n^+$-type region 5b toward the drain is about 0.3 µm to 0.5 µm. A distance x5 from an edge of the interlayer insulating film 11 toward the source to an edge of the gate electrode 9 toward the source is about 0.3 µm to 0.6 µm.

Operation of the semiconductor device according to the embodiment will be described. The conductive layer 22 constituting the trench-type SBD 42 is covered by the $p^+$-type region 21 at the bottom and the bottom corner part of the gate trench 7. Therefore, when the trench gate MOSFET 41 is in the OFF state, a depletion layer in the $p^+$-type region 21 spreads from the pn junction of the $p^+$-type region 21 and the n-type current spreading region 3 (or the $n^-$-type drift region 2 depending on the depth of the n-type current spreading region 3). As a result, electric field applied to a part of the conductive layer 22 along the inner wall of the gate trench 7 is mitigated and therefore, leak current may be reduced. In other words, the breakdown voltage is determined by a depth position of a pn junction of the $p^+$-type region 21 and the n-type current spreading region 3 and impurity concentrations of the $p^+$-type region 21 and the n-type current spreading region 3.

Further, when a parasitic pn diode formed by the pn junction of the p-type base region 4 and the n-type current spreading region 3 of the trench gate MOSFET 41 is forward biased, the trench-type SBD 42 is turned ON sooner than the parasitic pn diode by lower voltage than that for the parasitic pn diode of the trench gate MOSFET 41. Therefore, no base current flows in a vertical parasitic npn bipolar transistor (body diode) constituted by the n-type current spreading region 3, the p-type base region 4 and the $n^+$-type source region 5 of the trench gate MOSFET 41 and thus, the parasitic npn bipolar transistor does not operate. Accordingly, forward direction degradation due to the parasitic npn bipolar transistor does not occur. Additionally, turn-OFF loss due to the parasitic npn bipolar transistor may be reduced.

Figure 2:
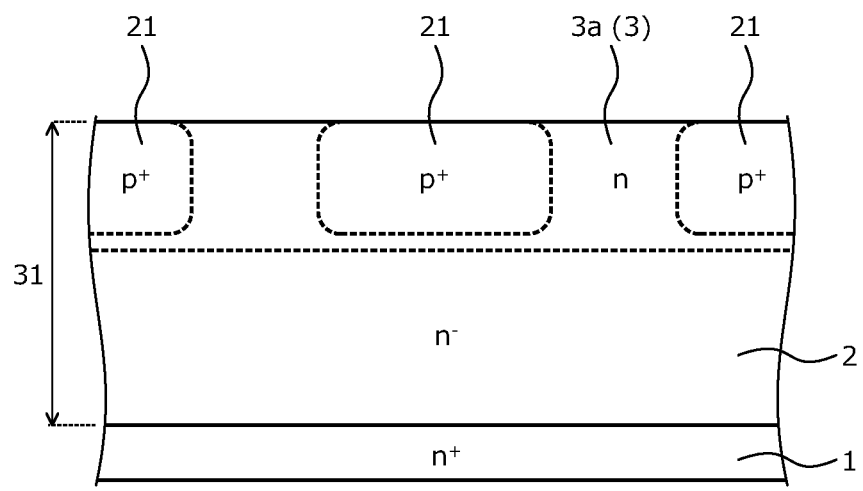
FIG. 2 is a cross-sectional view of the semiconductor device according to the embodiment during manufacture.

A method of manufacturing the semiconductor device according to the embodiment will be described. FIGS. 2, 3, 4, 5, 6, 7, 8, 9, 10, and 11 are cross-sectional views of the semiconductor device according to the embodiment during manufacture. First, as depicted in FIG. 2, the $n^+$-type silicon carbide substrate 1 constituting an $n^+$-type drain region is prepared. Next, on the front surface of the $n^+$-type silicon carbide substrate 1, the $n^-$-type silicon carbide layer 31 is formed by epitaxial growth. Next, by photolithography and ion implantation of a p-type impurity, the $p^+$-type region 21 is selectively formed in a surface layer of the $n^-$-type silicon carbide layer 31.

Next, by photolithography and ion implantation of an n-type impurity, for example, an n-type region (hereinafter, n-type sub-region) 3a is formed in the surface layer of the $n^-$-type silicon carbide layer 31, across the active region entirely. The n-type sub-region 3a is a part of the n-type current spreading region 3. A depth of the n-type sub-region 3a may be variously changed. FIG. 2 depicts a case in which the n-type sub-region 3a is provided at a depth deeper than the depth of the $p^+$-type region 21 and is in contact with an entire side (side facing toward the $n^+$-type silicon carbide substrate 1) of the $p^+$-type region 21 facing toward the drain (similarly in FIGS. 3 to 11). A part of the $n^-$-type silicon carbide layer 31 closer to the drain than is the n-type sub-region 3a is the $n^-$-type drift region 2. A sequence in which the n-type sub-region 3a and the $p^+$-type region 21 are formed may be interchanged.

Figure 3:
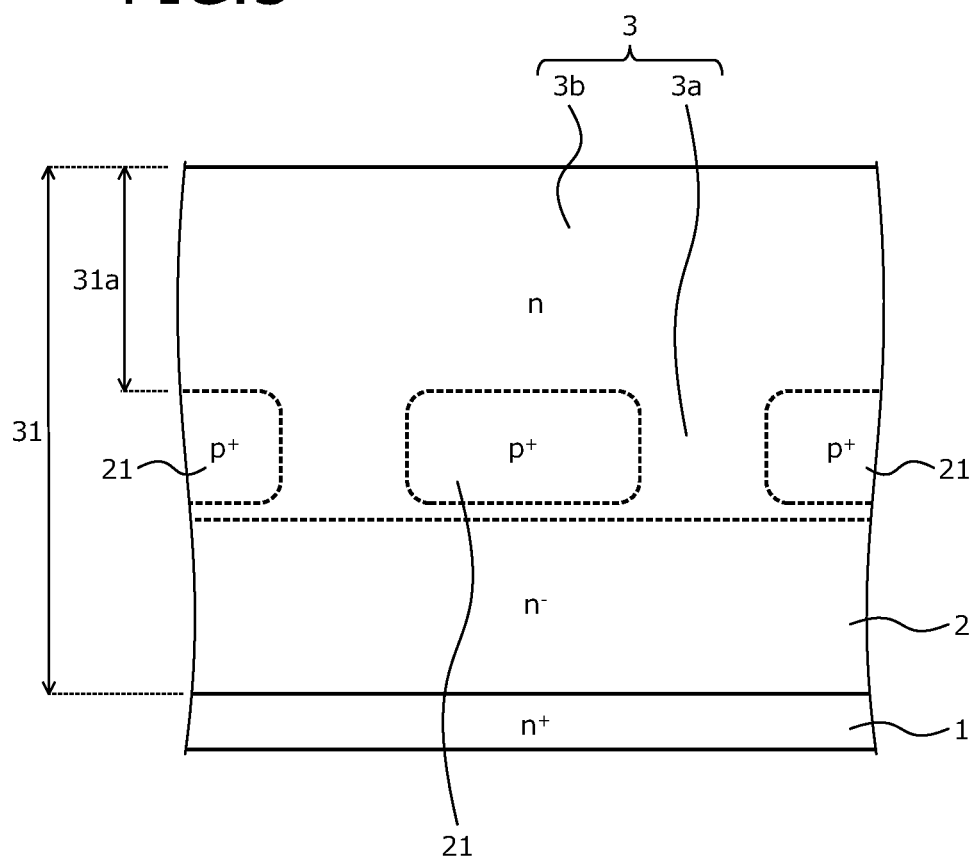
FIG. 3 is a cross-sectional view of the semiconductor device according to the embodiment during manufacture.

Next, as depicted in FIG. 3, an $n^-$-type silicon carbide layer is further formed on the $n^-$-type silicon carbide layer 31 by epitaxial growth, thereby increasing the thickness of the $n^-$-type silicon carbide layer 31. Next, by photolithography and ion implantation of an n-type impurity, for example, across the entire active region at a part 31a where the thickness of the $n^-$-type silicon carbide layer 31 is increased, an n-type sub-region 3b is formed to a depth reaching the n-type sub-region 3a. The n-type sub-region 3b has an impurity concentration that is substantially equal to that of the n-type sub-region 3a. The n-type sub-regions 3a, 3b are connected in the depth direction, whereby the n-type current spreading region 3 is formed. When the thickness of the $n^-$-type silicon carbide layer 31 is increased, an n-type silicon carbide layer having an impurity concentration equal to that of the n-type current spreading region 3 may be formed by epitaxial growth as the n-type sub-region 3b.

Figure 4:
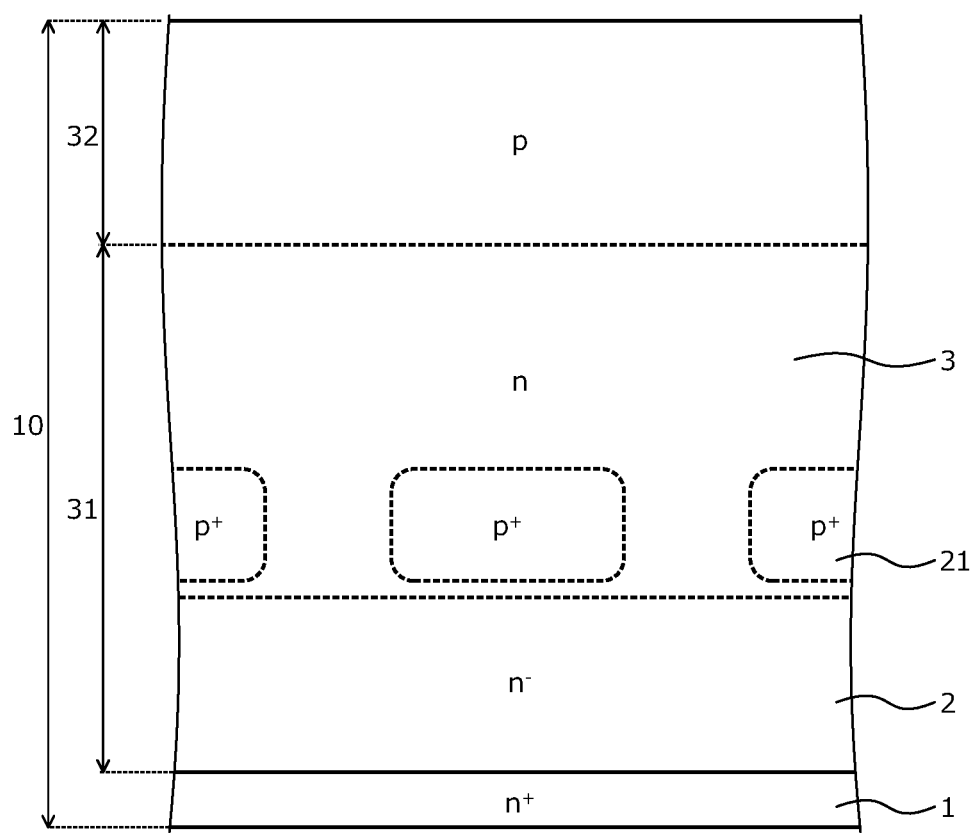
FIG. 4 is a cross-sectional view of the semiconductor device according to the embodiment during manufacture.
Figure 5:
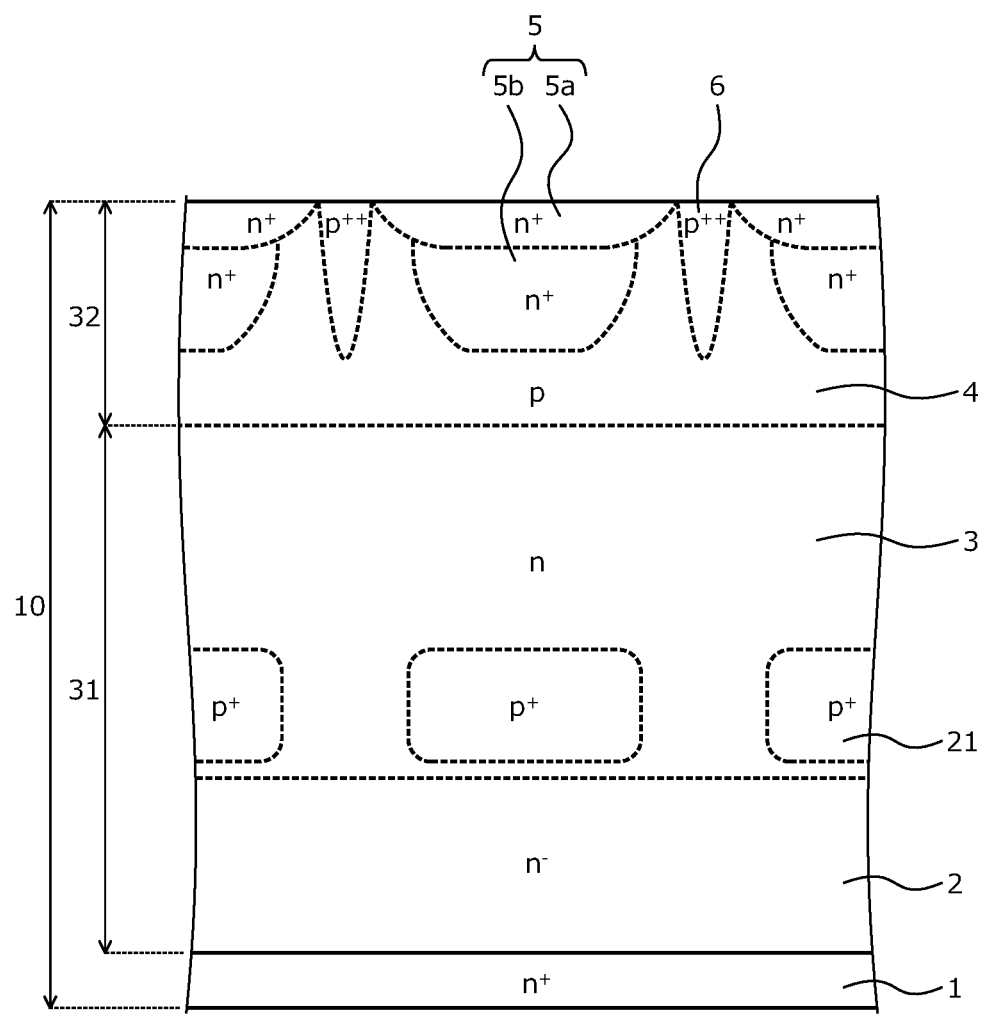
FIG. 5 is a cross-sectional view of the semiconductor device according to the embodiment during manufacture.

Next, as depicted in FIG. 4, the p-type silicon carbide layer 32 is formed on the $n^-$-type silicon carbide layer 31 by epitaxial growth. As a result, the silicon carbide substrate (semiconductor wafer) 10 is formed in which the $n^-$-type silicon carbide layer 31 and the p-type silicon carbide layer 32 are sequentially stacked on the $n^+$-type silicon carbide substrate 1. Next, as depicted in FIG. 5, by a process including photolithography and ion implantation as a set is repeatedly performed under different conditions, thereby selectively forming in a surface layer of the p-type silicon carbide layer 32, the first and the second n+-type regions 5a, 5b (n+-type source region 5) and the p++-type contact region 6, respectively. Subsequently, heat treatment (activation annealing) for activating the impurities is performed with respect to all of the regions formed by ion implantation.

In the ion implantation for forming the first n+-type region 5a, for example, phosphorus (P) or arsenic (As) is used as a dopant, forming the first n+-type region 5a to have an impurity concentration that is higher than that of the second n+-type region 5b. In the ion implantation for forming the second n+-type region 5b, for example, nitrogen (N) is used as a dopant, forming the second n+-type region 5b to be deeper than the first n+-type region 5a. A sequence in which the first and the second n+-type regions 5a, 5b and the p++-type contact region 6 are formed may be interchanged. A part of the p-type silicon carbide layer 32 other than the first and the second n+-type regions 5a, 5b and the p++-type contact region 6 is the p-type base region 4.

Figure 6:
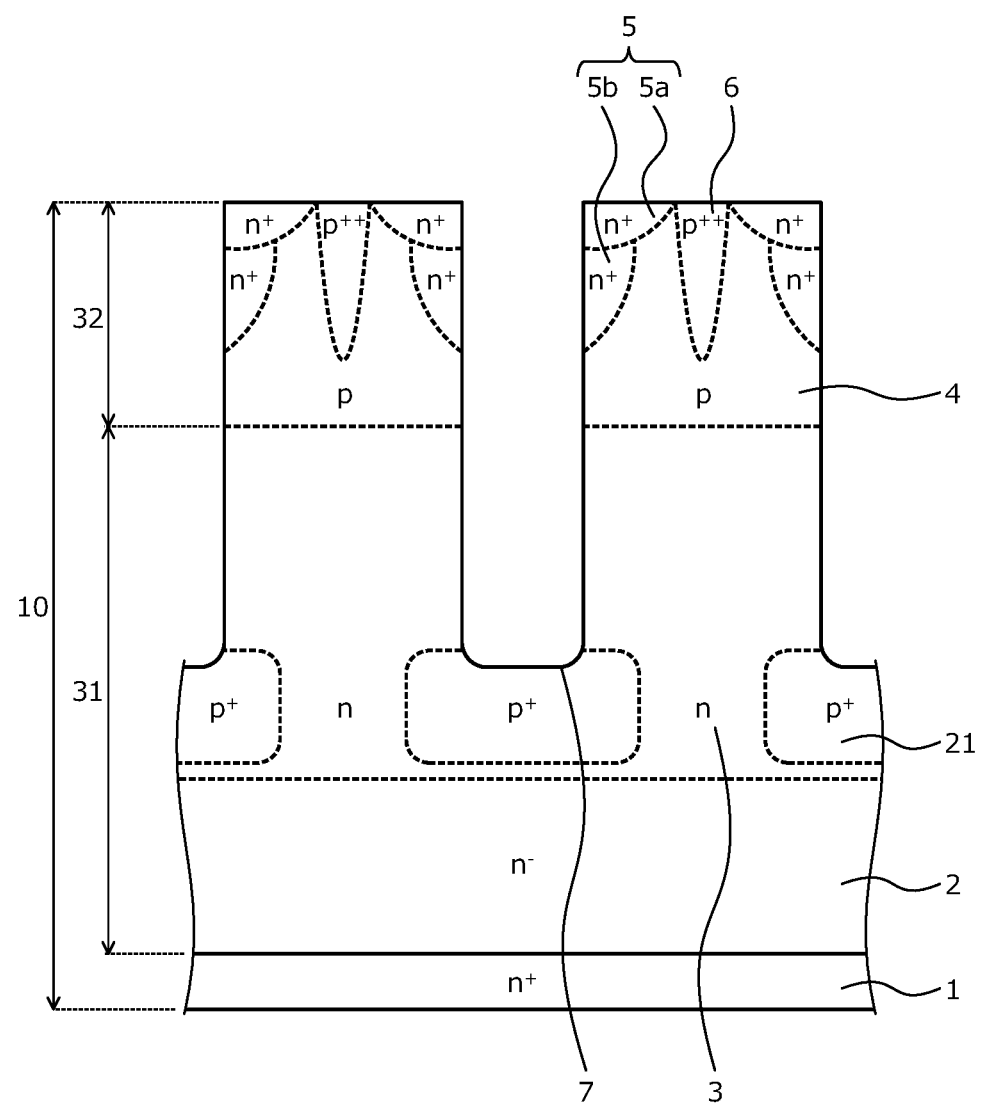
FIG. 6 is a cross-sectional view of the semiconductor device according to the embodiment during manufacture.
Figure 7:
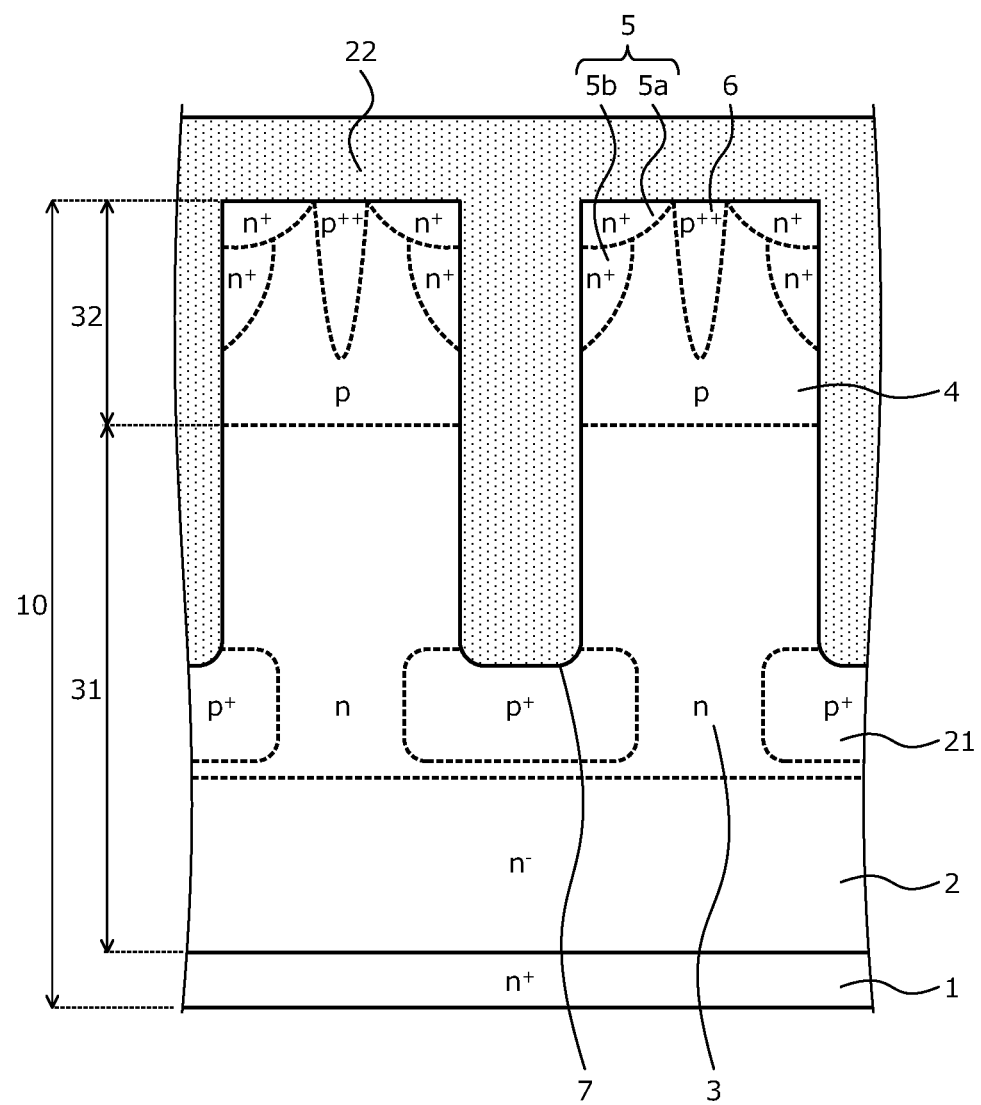
FIG. 7 is a cross-sectional view of the semiconductor device according to the embodiment during manufacture.
Figure 8:
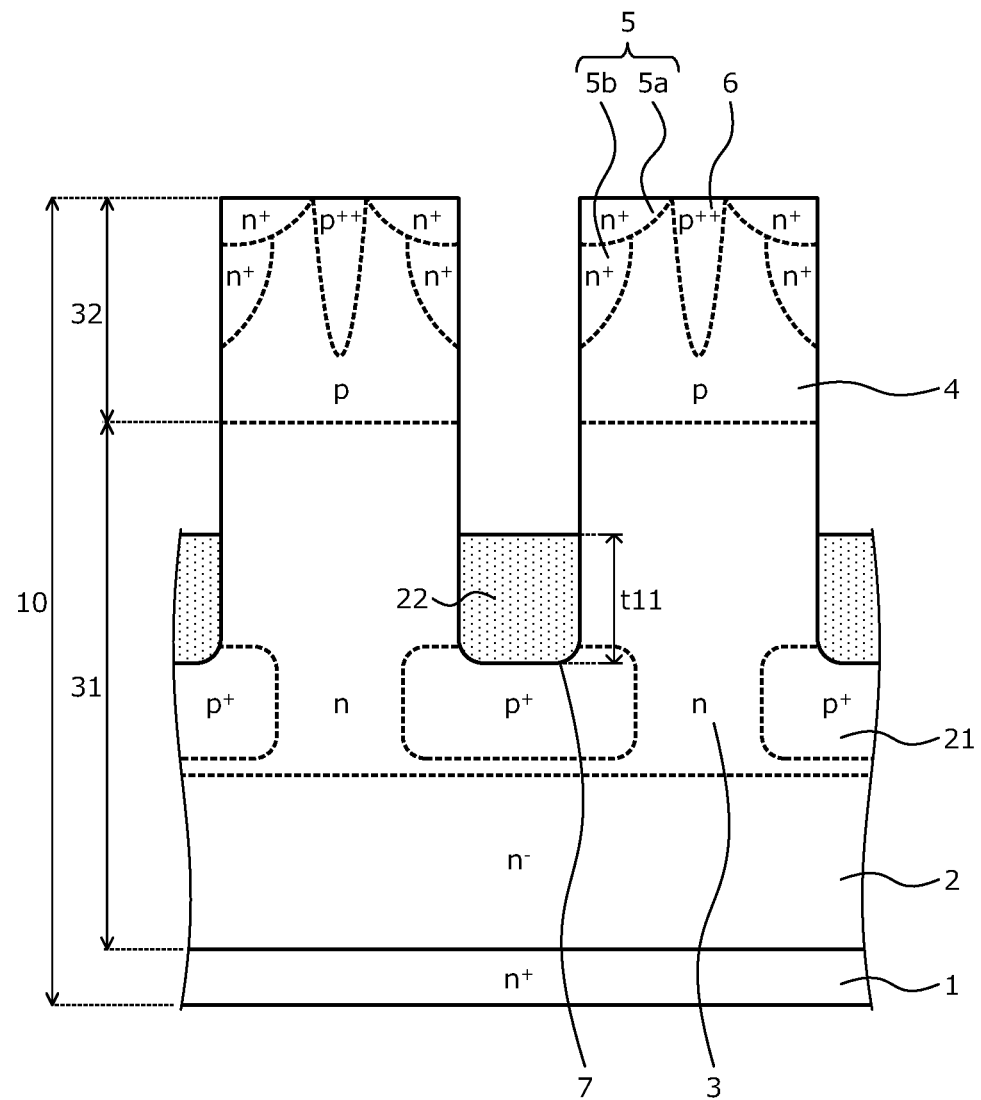
FIG. 8 is a cross-sectional view of the semiconductor device according to the embodiment during manufacture.

Next, as depicted in FIG. 6, the gate trench 7 is formed penetrating the first and the second n+-type regions 5a, 5b and the p-type base region 4 to reach the first p+-type region 21 in the n-type current spreading region 3. Next, as depicted in FIG. 7, for example, by a deposition method, the conductive layer 22 such as, for example, a metal layer, poly-silicon (poly-Si), etc. is deposited on the front surface of the semiconductor substrate 10 so as to be embedded in the gate trench 7. Next, as depicted in FIG. 8, the conductive layer 22 is etched, leaving the conductive layer 22 in the trench 7, only toward the bottom; the conductive layer 22 having the predetermined thickness t11. The thickness t11 of the conductive layer 22 is assumed to be equal to the distance x1 from the interface of the conductive layer 22 and the insulating layer 8a, to the bottom of the gate trench 7 as described above.

Figure 9:
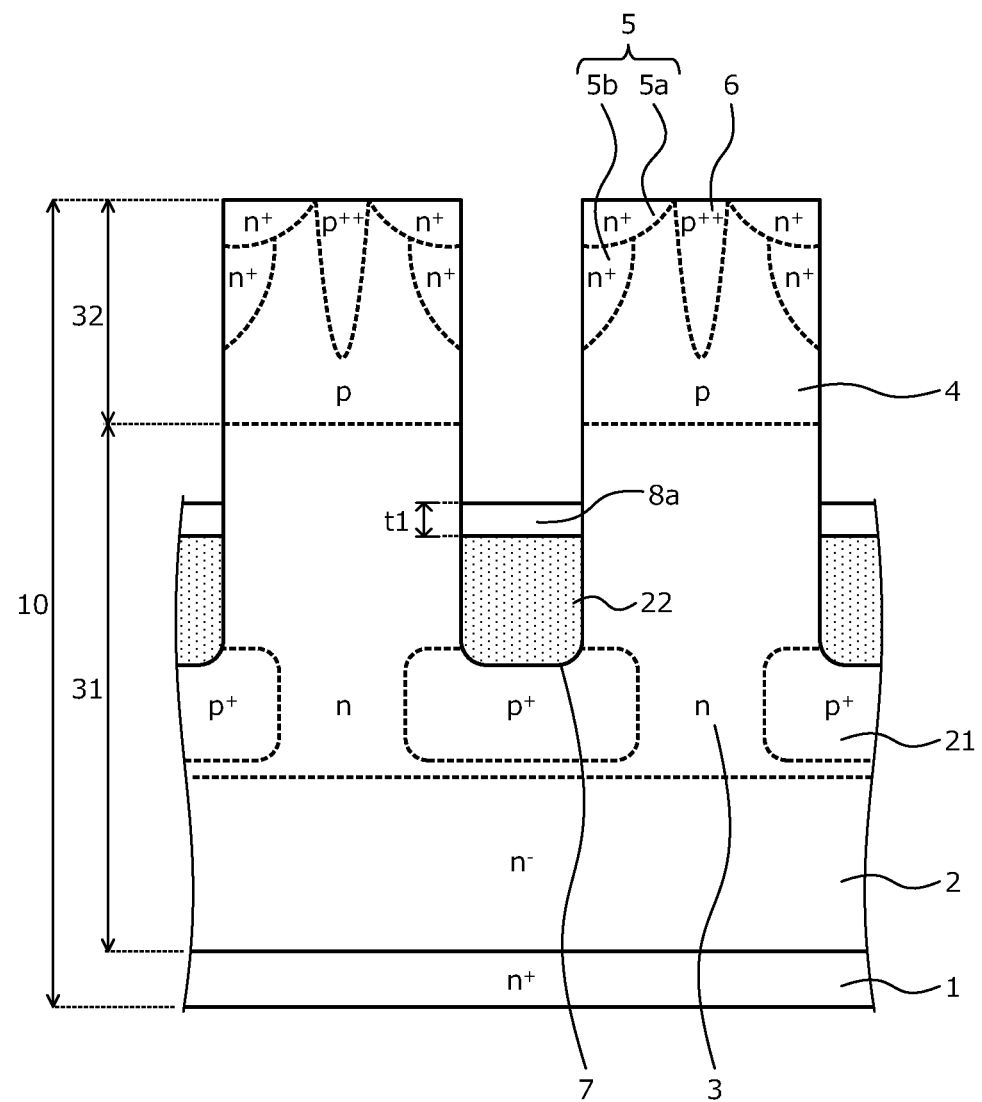
FIG. 9 is a cross-sectional view of the semiconductor device according to the embodiment during manufacture.
Figure 10:
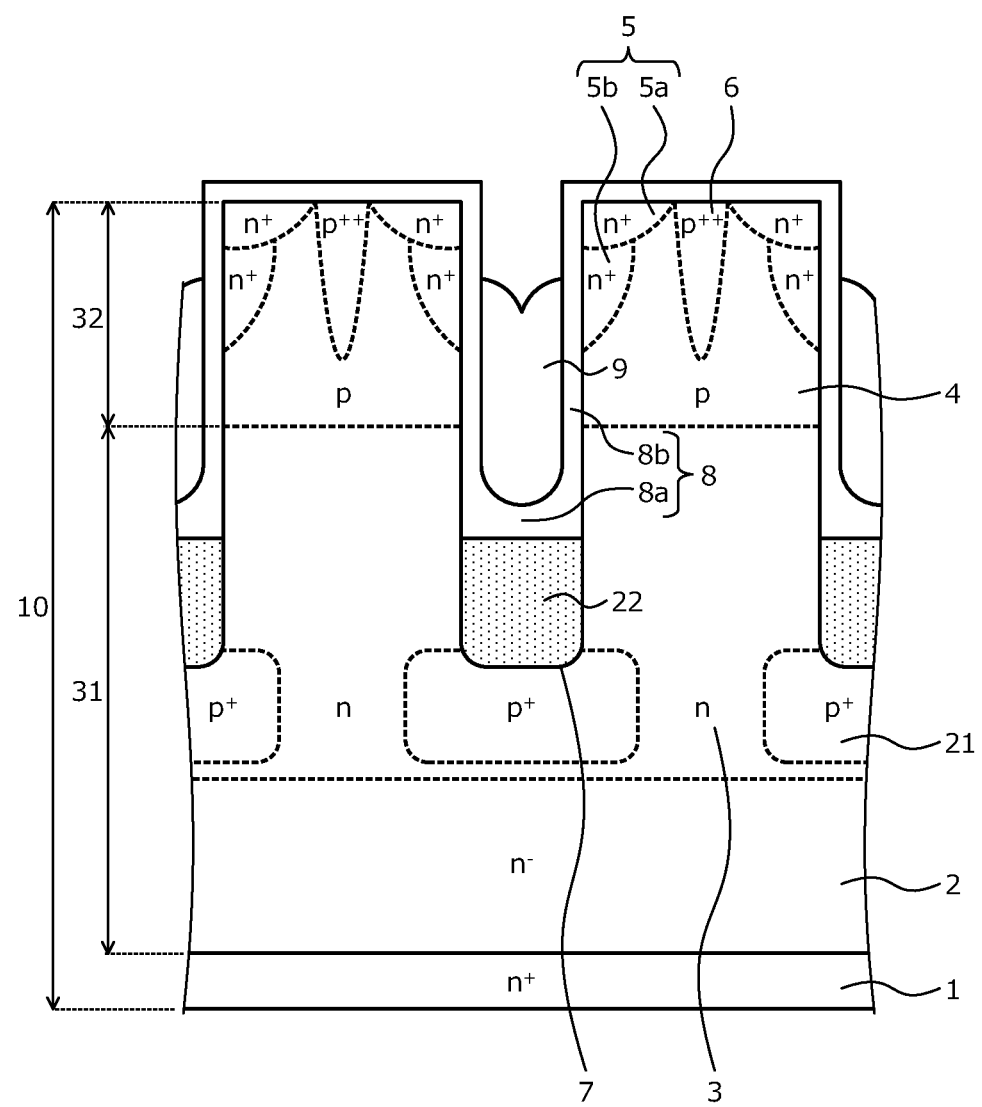
FIG. 10 is a cross-sectional view of the semiconductor device according to the embodiment during manufacture.

Next, as depicted in FIG. 9, for example, by a deposition method, the insulating layer 8a is deposited on the front surface of the semiconductor substrate 10 so as to be embedded in the gate trench 7. Next, the insulating layer 8a is etched, leaving the insulating layer 8a only in the gate trench 7, the insulating layer 8a having the predetermined thickness t1. Next, as depicted in FIG. 10, the front surface of the semiconductor substrate 10 and the side walls of the gate trench 7 are thermally oxidized, forming the insulating film 8b along the front surface of the semiconductor substrate 10 and the side walls of the gate trench 7, the insulating film 8b being in contact with and continuous with the insulating layer 8a. As a result, the gate insulating film 8 constituted by the insulating layer 8a and the insulating film 8b is formed in the gate trench 7.

Figure 11:
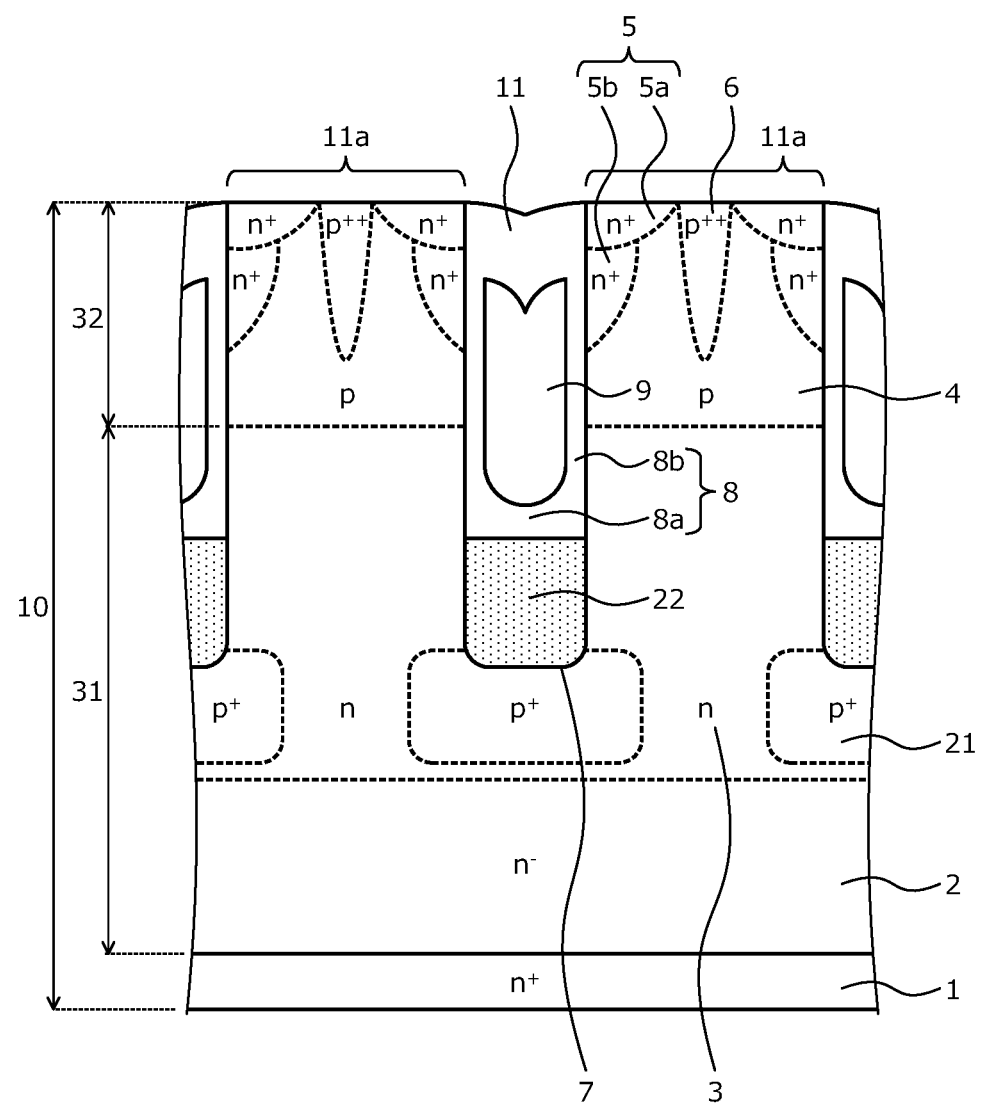
FIG. 11 is a cross-sectional view of the semiconductor device according to the embodiment during manufacture.
Figure 12:
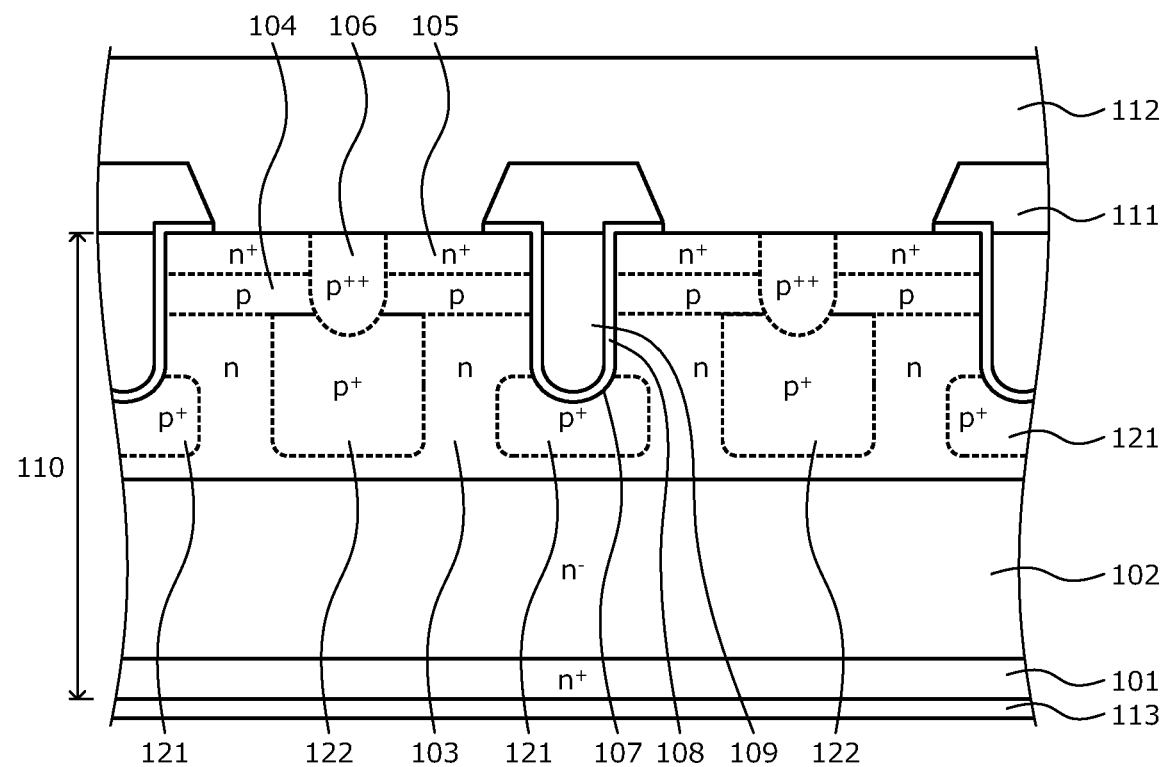
FIG. 12 is a cross-sectional view of a structure of a conventional semiconductor device.

Next, for example, by a deposition method, for example, a poly-silicon layer is deposited on the front surface of the semiconductor substrate 10 so as to be embedded in the gate trench 7. Next, the poly-silicon layer is etched, leaving the poly-silicon layer only in the gate trench 7 to thereby form the gate electrode 9. Next, as depicted in FIG. 11, for example, by a deposition method, the interlayer insulating film 11 is formed on the front surface of the semiconductor substrate 10 so as to be embedded in the gate trench 7. Next, the interlayer insulating film 11 and the insulating film 8b are etched, leaving the interlayer insulating film 11 and the insulating film 8b only in the gate trench 7. As a result, between adjacent gate trenches 7, the front surface of the semiconductor substrate 10 is exposed.

A part of the front surface of the semiconductor substrate 10 not covered by the interlayer insulating film 11 is a contact hole 11a for forming an electrical contact of the source electrode 12a and a silicon region (the first n+-type region 5a and the p++-type contact region 6). Next, by a general method, the source electrode 12a is formed that is in ohmic contact with the first n+-type region 5a and the p++-type contact region 6. The source electrode pad 12b is formed in contact with the source electrode 12a. At the rear surface of the semiconductor substrate 10, the drain electrode 13 is formed. Thereafter, semiconductor wafer is diced (cut) into individual chips, thereby completing the MOSFET depicted in FIG. 1.

As described, according to the embodiment, in a single trench, a single unit cell of a trench gate MOSFET and a single unit cell of a trench-type SBD are disposed, realizing in the single gate trench, a function of a MOSFET and a function of a SBD. In other words, provision of a trench-type SBD between adjacent gate trenches like in the conventional structure (refer to FIG. 13) is unnecessary. Therefore, even when a trench-type SBD is built-in on the same semiconductor chip as a trench gate MOSFET, the cell pitch (distance between adjacent gate trenches) may be reduced, whereby the ON resistance may be reduced by a reduction of the cell pitch.

Further, according to the embodiment, since the trench-type SBD is built-in on the same semiconductor chip as the trench gate MOSFET, increases in turn-ON loss and degradation of the parasitic diode (body diode) formed in the trench gate MOSFET may be circumvented.

In the embodiments of the present invention, various modifications within a scope not departing from the spirit of the invention are possible. For example, in the embodiments, dimensions, impurity concentrations, etc. of regions may be variously set according to required specifications. Further, in the embodiments, while a case where an epitaxial substrate in which a silicon carbide layer is formed on a silicon carbide substrate by epitaxial growth has been described as an example, regions constituting a semiconductor device according to the present invention may be formed in the silicon carbide substrate, for example, by ion implantation, etc. Further, the present invention is further applicable to a wide bandgap semiconductor material other than silicon carbide (for example gallium (Ga), etc.). The present invention is similarly implemented when the conductivity types (n-type, p-type) are inverted.

According to the embodiments of the present invention, provision of the trench-type SBD between adjacent gate trenches like in the conventional structure (refer to FIG. 13) is unnecessary. Therefore, even when a trench-type SBD is built-in on the same semiconductor chip as a trench-gate MOS semiconductor device, the cell pitch (distance between adjacent gate trenches) may be reduced.

The semiconductor device according to the present invention achieves an effect in that the ON resistance may be reduced by a reduction of the cell pitch.

As described, the semiconductor device according to the present invention is useful for MOS-type semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate containing a semiconductor material having a bandgap that is wider than that of silicon;

a first semiconductor layer of a first conductivity type provided on a front surface of the semiconductor substrate, the first semiconductor layer containing a semiconductor material having a bandgap that is wider than that of silicon;

a second semiconductor layer of a second conductivity type provided on a first side of the first semiconductor layer, opposite a second side of the first semiconductor layer facing toward the semiconductor substrate, the second semiconductor layer containing a semiconductor material having a bandgap that is wider than that of silicon;

a first semiconductor region of the first conductivity type selectively provided in the second semiconductor layer;

a trench penetrating the first semiconductor region and the second semiconductor layer, and reaching the first semiconductor layer;

a second semiconductor region underlying a bottom of the trench and selectively provided in the first semiconductor layer, separated from the second semiconductor layer;

a conductive layer provided in the trench;

an insulating layer provided on the conductive layer, in the trench;

an insulating film provided along a side wall of the trench and in contact with and continuous with the insulating layer;

a gate electrode provided on the insulating layer and the insulating film, in the trench;

a first electrode in contact with the second semiconductor layer and the first semiconductor region, and electrically connected to the conductive layer;

a second electrode provided at a rear surface of the semiconductor substrate; and a Schottky barrier diode constituted by a Schottky junction of the conductive layer and the first semiconductor layer.

2. The semiconductor device according to claim 1, wherein
an interface of the conductive layer and the insulating layer is positioned closer to the semiconductor substrate than is an interface of the second semiconductor layer and the first semiconductor layer.

3. The semiconductor device according to claim 1, wherein
a distance from an interface of the conductive layer and the insulating layer, to an interface of the second semiconductor layer and the first semiconductor layer is in a range from 0.3 µm to 0.6 µm.

4. The semiconductor device according to claim 1, wherein
the trench has a depth that is in a range of 1.1 µm to 3.2 µm, and
the conductive layer has a thickness that is in a range of 0.1 µm to 0.6 µm.

5. A semiconductor device, comprising
a semiconductor substrate containing a semiconductor material having a bandgap that is wider than that of silicon;
a first semiconductor layer of a first conductivity type provided on a front surface of the semiconductor substrate, the first semiconductor layer containing a semiconductor material having a bandgap that is wider than that of silicon;
a second semiconductor layer of a second conductivity type provided on a first side of the first semiconductor layer, opposite a second side of the first semiconductor layer facing toward the semiconductor substrate, the second semiconductor layer containing a semiconductor material having a bandgap that is wider than that of silicon;

a first semiconductor region of the first conductivity type selectively provided in the second semiconductor layer;

a trench penetrating the first semiconductor region and the second semiconductor layer, and reaching the first semiconductor layer;

a second semiconductor region underlying a bottom of the trench and selectively provided in the first semiconductor layer, separated from the second semiconductor layer;

a conductive layer provided in the trench;

an insulating layer provided on the conductive layer, in the trench;

an insulating film provided along a side wall of the trench and in contact with and continuous with the insulating layer;

a gate electrode provided on the insulating layer and the insulating film, in the trench;

a first electrode in contact with the second semiconductor layer and the first semiconductor region;

a second electrode provided at a rear surface of the semiconductor substrate;

a third semiconductor region of the first conductivity type provided in the first semiconductor layer, the third semiconductor region being in contact with the second semiconductor layer and reaching a deep position closer to the second electrode from the interface of the first semiconductor layer and second semiconductor layer than is the bottom of the trench, the third semiconductor region having an impurity concentration higher than an impurity concentration of the first semiconductor layer; and a Schottky barrier diode is-constituted by a Schottky junction of the conductive layer and the third semiconductor region.

6. The semiconductor device according to claim 1, wherein
a width of the second semiconductor region underlying the bottom of the trench in a first direction perpendicular to a depth direction of the trench is greater than a width of the trench in the first direction.

7. The semiconductor device according to claim 1, wherein
the conductive layer is provided entirely within the trench.

8. The semiconductor device according to claim 1, wherein
the conductive layer comprises polysilicon.

9. The semiconductor device according to claim 1, wherein
the gate electrode is electrically insulated from the conductive layer by the insulating layer and the insulating film.

10. The semiconductor device according to claim 1, wherein
the conductive layer has a thickness in a depth direction of the trench equal to a distance from an interface of the conductive layer and the insulating layer to the bottom of the trench.

11. The semiconductor device according to claim 1, wherein a thickness of the insulating layer in a depth direction of the trench is greater than a width of the insulating film in a direction perpendicular to the depth direction of the trench.

12. The semiconductor device according to claim 1, wherein
the second semiconductor region is formed in the surface layer of the first semiconductor layer by photolithography and ion implantation.

13. The semiconductor device according to claim 1, wherein
the conductive layer is provided in the trench by a deposition method.

14. The semiconductor device according to claim 1, further comprising a contact region of the second conductivity type, provided in the second semiconductor layer between the trench and an adjacent trench, and in contact with the first semiconductor region.

15. The semiconductor device according to claim 14, wherein
the first semiconductor region includes a first subregion of the first conductivity type and a second subregion of the first conductivity type, the first subregion having an impurity concentration higher than an impurity concentration of the second subregion, and
a depth of the contact region is deeper in a depth direction of the trench than the first subregion.

16. The semiconductor device according to claim 14, further comprising:
an interlayer insulating film to cover the gate electrode in the trench,
wherein
the first electrode is in contact with the first semiconductor region and the contact region via a contact hole opened in the interlayer insulating film, and is electrically connected with the first semiconductor region and the contact region.

17. The semiconductor device according to claim 1, wherein
the conductive layer is provided entirely below the insulating layer and the gate electrode.

* * * * *